(12) United States Patent
Ge

(10) Patent No.: US 6,942,935 B2
(45) Date of Patent: Sep. 13, 2005

(54) FOODWARE WITH A TARNISH-RESISTANT CERAMIC COATING AND METHOD OF MAKING

(75) Inventor: Molly Mo Hui Ge, Arlington Heights, IL (US)

(73) Assignee: National Material IP, Elkgrove Village, IL (US)

( * ) Notice: Subject to any disclaimer, the term of this patent is extended or adjusted under 35 U.S.C. 154(b) by 146 days.

(21) Appl. No.: 10/395,453

(22) Filed: Mar. 24, 2003

(65) Prior Publication Data

US 2004/0191579 A1 Sep. 30, 2004

(51) Int. Cl.$^7$ .................................................. B32B 4/00
(52) U.S. Cl. ........................ 428/698; 428/212; 428/336; 428/216; 428/469; 428/472; 428/697; 428/699
(58) Field of Search ................................. 428/697, 698, 428/699, 472, 469, 212, 216, 336

(56) References Cited

U.S. PATENT DOCUMENTS

| | | | |
|---|---|---|---|
| 3,958,070 A | | 5/1976 | Schintlmeister et al. |
| 3,983,275 A | | 9/1976 | Winter et al. |
| 5,262,241 A | | 11/1993 | Huggins |
| 5,403,882 A | | 4/1995 | Huggins |
| 5,447,803 A | | 9/1995 | Nagaoka et al. |
| 5,549,975 A | * | 8/1996 | Schulz et al. |
| 5,562,991 A | | 10/1996 | Tannenbaum |
| 5,679,448 A | * | 10/1997 | Kawata |
| 5,707,748 A | * | 1/1998 | Bergmann |
| 5,810,947 A | | 9/1998 | Wu et al. |
| 5,879,532 A | | 3/1999 | Foster et al. |

(Continued)

FOREIGN PATENT DOCUMENTS

| DE | 567388 | 1/1933 |
|---|---|---|

OTHER PUBLICATIONS

Jehn et al, "Morphology and properties of sputtered (Ti,Al)N layers on high speed steel substrates as a function of deposition temperature and sputtering atomosphere," J. Vac. Sci. Technol. A 4 (6), Nov./Dec. 1986, pp. 2701–2705.

Knotek, O., Bohmer, M. and Leyendecker, T., "On structure and properties of sputtered Ti and Al based hard compound films," J. Vac. Sci. Technol. A 4 (6), Nov./Dec. 1986, pp. 2695–2700.

Munz, Wolf–Dieter, "Titanium aluminum nitride films: A new alternative toTiN coatings," J. Vac. Sci. Technol. A 4 (6), Nov./Dec. 1986, pp. 2717–2725.

McIntyre et al., "Oxidation of metastable single–phase polycrystalline $Ti_{0.5}Al_{0.5}N$ films: Kinetics and mechanisms," J. Appl. Phys. 67 (3), Feb. 1, 1990, pp. 1542–1553.

(Continued)

*Primary Examiner*—Archene Turner
(74) *Attorney, Agent, or Firm*—Dinsmore & Shohl LLP

(57) ABSTRACT

A foodware article having a thermally stable color, tarnish-resistant ceramic coating that enables direct contact with a heat source, such as a gas flame or the heating element of an electric stove. The foodware article of the present invention includes a metal foodware article having an inner food-contacting surface and an outer heat source-contacting surface, a bonding layer deposited on a portion of the outer heat source-contacting surface, and a first ceramic layer deposited adjacent to a portion of the bonding layer, the first ceramic layer selected from (Ti,Al)N, (Ti,Al)CN, (Ti,Al,X)N, or (Ti,Al,X)CN. A top layer of TiCN can be deposited adjacent to the first ceramic layer. There may optionally be alternating layers of a third ceramic selected from (Ti,Al)N, (Ti,Al)CN, (Ti,Al,X)N, or (Ti,Al,X)CN and a fourth ceramic selected from TiN, TiCN, XN or XCN deposited adjacent to the bonding layer and below the first ceramic layer. The alternating layers can be repeated as many times as desired. A method of making such a foodware article is also disclosed.

19 Claims, 2 Drawing Sheets

U.S. PATENT DOCUMENTS

| | | | |
|---|---|---|---|
| 5,879,823 | A | 3/1999 | Prizzi et al. |
| 5,880,205 | A | 3/1999 | Tannenbaum |
| 6,080,496 | A | 6/2000 | Hupf et al. |
| 6,090,223 | A | 7/2000 | Kiuchi et al. |
| 6,103,074 | A | 8/2000 | Khominich |
| 6,114,028 | A | 9/2000 | Muchin et al. |
| 6,197,438 | B1 | 3/2001 | Faulkner |
| 6,360,423 | B1 | 3/2002 | Groll |
| 6,399,219 | B1 | 6/2002 | Welty et al. |
| 6,427,904 | B1 | 8/2002 | Groll |
| 6,497,772 | B1 | 12/2002 | Meckel et al. |
| 6,544,669 | B2 * | 4/2003 | Groll |
| 6,565,957 | B2 * | 5/2003 | Nakamura et al. |
| 6,617,057 | B2 * | 9/2003 | Gorokhovsky et al. |
| 2002/0040905 | A1 | 4/2002 | Groll |

OTHER PUBLICATIONS

Knotek, et al., "On Wear and Corrosion Resistant PVD CrN Coatings," 8. Int. Congr. on Heat Treatm. of Mater. Kyoto, Japan 1992, o.S., pp. 543–546.

Ichimura, Hiroshi, and Kawana, Atsuo, "High temperature oxidation of ion–plated CrN films," J. Mater. Res., Vol. 9, No. 1, Jan. 1994, pp. 151–155.

Donahue et al, "Microstructure and oxidation–resistance of $Ti_{1-x-y-z}Al_xCr_yY_zN$ layers grown by combined steered–arc/unbalanced–magnetron–sputter deposition," Surface and Coatings Technology 94–95, 1997, pp. 226–231.

Aouadi, S.M., Gorishnyy, T.Z., and Rohde, S.L., "In–Situ Ellipsometry Study on Nitride Coatings," Invited Paper, Vacuum Technology & Coating, Sep. 2002, pp. 33–38.

Anders, A., "Part 1: Cathodic Arc Plasma Deposition," Vacuum Technology & Coating, Jul. 2002, pp. 27–35.

Hovsepian et al., Advanced Application Tailored PVD Coatings Utilizing Nanoscale Multilayer Superlattice Structures, pp. 29–35, Nov. 2002.

Pellman, M., Multi–Arc, Inc., PVD Coatings for Medical Device Applications, http:/www.pfonline.com/articles/070003.html, Jul. 2000.

Aharonov et al., How Chromium Nitride performs on metal forming dies, The Fabricator, Jun. 1995, pp. 26–29.

Wadsworth et al., Thermal stability and oxidation resistance of TiAlN/CrN multilayer coatings, Surface and Coatings Technology 94–95 (1997) 315–321.

Chiba et al., Wear resistance of arc ion–plated chromium nitride coatings, J. Mater. Res., vol. 8, No. 5, May 1993, pp. 1109–1115.

Ghosh et al., Study of the relative wear and abrasion resistance of Ti(C,N) and TiN coatings, Surface and Coatings Technology, 54/55, (1992), pp. 466–469.

Randhawa et al., New developments In decorative vacuum coatings, Metal Finishing, Sep. 1988, copyright 1988 by Metals and Plastics Publications, Inc., pp. 15–18.

Bull et al., Properties and performance of commercial TiCN coatings. Part 1: coating architecture and hardness modelling, Surface and Coatings Technology, 163–164, (2003), pp. 499–506.

Bull et al., Properties and performance of commercial TiCN coatings. Part 2: tribological performance, Surface and Coatings Technology, 163–164, (2003), pp. 507–514.

* cited by examiner

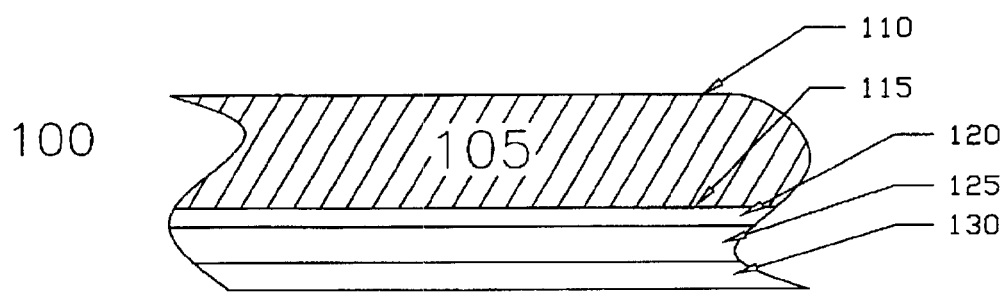
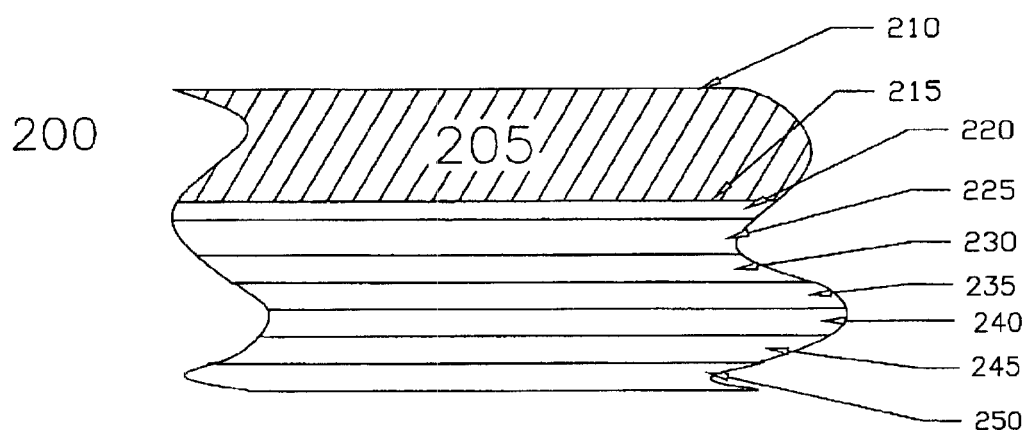

FOODWARE WITH A TARNISH-RESISTANT CERAMIC COATING AND METHOD OF MAKING

BACKGROUND OF THE INVENTION

The invention relates generally to a foodware article having a tarnish-resistant coating, and more particularly to a foodware article having a thermally stable, tarnish-resistant, ceramic coating on the outer heat source-contacting surface, and to a method of making such foodware articles.

Ceramic coatings, such as TiN, ZrCN, and TiCN, have been used in a variety of applications, including faucets, door hardware, signs, various architectural uses, and other industries because of their decorative appearance and anti-tarnish properties. These applications do not involve direct contact with a heat source, such as gas flame or electric heating element.

Ceramic coatings have been used as non-stick coatings or for stick resistance on the food-contacting surface of cookware, for example, U.S. Pat. Nos. 5,447,803, 6,197,438, and 6,360,423. However, these coatings were not used on the heat source-contacting surface of the cookware. Moreover, U.S. Pat. No. 6,197,438 states that various ceramic coatings, including TiN, TiCN, ZrN, CrN, and AlTiN, have poor flame color stability. It does not describe what tests were run or the conditions under which they were performed.

Cookware can be made from a variety of materials, including cast iron, copper, aluminum, and steel. Each type of cookware has advantages and disadvantages.

Seasoned cast iron cookware has a tough, abrasion resistant surface. However, cast iron is subject to rusting, and it must be cleaned carefully to avoid damage to the cookware surface. In addition, acidic foods can cause leaching of the iron from the surface, which can lead to health problems in some cases.

Copper cookware has excellent heat transfer properties. However, it is easily scratched because it is much softer than other cookware materials, such as cast iron or stainless steel. Copper also oxidizes readily, which leads to tarnishing. Copper can be polished to remove the tarnish, but it requires substantial effort to maintain the surface finish.

Aluminum cookware has excellent heat transfer properties. However, aluminum also tarnishes easily. It cannot be polished, but it must be scoured on a regular basis because stovetop burners and food particles can easily discolor it.

Stainless steel cookware is widely used. It is known for its strength and durability. Stainless steel is relatively easy to clean, and it holds its shine better than copper. However, stainless steel is a poor heat conductor. In order to overcome its poor heat conducting properties, aluminum or copper disks are often added to the bottom of stainless steel pots or pans. In many cases, the bottom of the foodware is made of copper or is copper-plated. Alternatively, aluminum or copper layers are clad with stainless steel to produce a multi-layer product. However, if a stainless steel pan has exposed copper, the copper has to be polished to keep it shiny.

Although many people like the appearance of copper cookware, the amount of time and effort required to maintain the finish prevents many people from using it. Therefore, there is a need for an easy-to-maintain, tarnish-resistant coating for foodware.

SUMMARY OF THE INVENTION

The present invention meets this need by providing a foodware article having a thermally-stable color, tarnish-resistant, ceramic coating on an outer heat source-contacting surface. By "foodware," I mean cookware, food preparation pieces including cutlery and other manual food processing pieces (such as colanders, strainers, and the like), food serving pieces (such as plates, bowls, and the like), and utensils for eating food. By "cookware," I mean pots and pans for stovetop cooking, bakeware, griddles, grills, cooking utensils (such as spoons, spatulas, and the like), and food preparation devices that are used to cook food (such as electric frying pans, rice cookers, and the like). By "tarnish-resistant," I mean the ceramic coating is anti-tarnish in air atmosphere and can withstand direct heating without the coating tarnishing or peeling off.

In one embodiment, the foodware article of the present invention includes a metal foodware article having an inner food-contacting surface and an outer heat source-contacting surface; a bonding layer deposited on a portion of the outer heat source-contacting surface; and a first ceramic layer deposited adjacent to a portion of the bonding layer, the first ceramic layer selected from (Ti,Al)N, (Ti,Al)CN, (Ti,Al,X)N, or (Ti,Al,X)CN. By "deposited on," I mean deposited directly on the previous layer without any intervening layers. By "deposited adjacent to," I mean deposited next to, but not necessarily directly on, the previous layer. It could be deposited directly on the previous layer, or there could be one or more intervening layers between layers deposited adjacent to one another. By "(Ti,Al,X)N, or (Ti,Al,X)CN," I mean nitride or carbonitride alloys having titanium and aluminum as the major components, with lesser amounts of other elements ("X"). Other elements include, but are not limited to, chromium, and yttrium. The (Ti,Al,X)N, or (Ti,Al,X)CN alloys include, but are not limited to, superlattice structured (Ti,Al)N/XN or (Ti,Al)CN/XN.

There can be a top layer of TiCN deposited on a portion of the first ceramic layer to obtain a copper-style color, if desired. By "copper-style color," I mean a color that has the appearance of copper including, for example, colors similar to bronze, rose gold, or copper.

There may optionally be a second ceramic layer deposited adjacent to the bonding layer and below the first ceramic layer, the second ceramic layer selected from TiN, TiCN, XN, or XCN.

There may optionally be alternating layers of a third ceramic selected from (Ti,Al)N, (Ti,Al)CN, (Ti,Al,X)N, or (Ti,Al,X)CN and a fourth ceramic selected from TiN, TiCN, XN, or XCN deposited adjacent to the bonding layer and below the first ceramic layer. The alternating layers can be repeated as many times as desired.

The metal foodware article can be made of materials including, but not limited to, steel, stainless steel, titanium, clad material, or alloys thereof.

The bonding layer can be made of a metal including, but not limited to, titanium, chromium, zirconium, or alloys thereof.

Another aspect of the invention is a method of making a foodware article having a thermally-stable color, tarnish-resistant, ceramic coating. The method includes providing a metal substrate having an inner food-contacting surface and an outer heat source-contacting surface; depositing a bonding layer on a portion of the outer heat-source contacting surface; depositing a first ceramic layer adjacent to a portion of the bonding layer, the first ceramic layer selected from (Ti,Al)N, (Ti,Al)CN, (Ti,Al,X)N, or (Ti,Al,X)CN; and forming the metal substrate into the foodware article. The metal substrate can be formed into the foodware article either before or after the coating is deposited.

The layers may be deposited by a method including, but not limited to, a physical vapor deposition method. The layers may be deposited by a cathodic arc deposition process, if desired.

BRIEF DESCRIPTION OF THE DRAWINGS

FIG. 1 is a cross-section of one embodiment of the foodware article of the present invention.

FIG. 2 is a cross-section of another embodiment of the foodware article of the present invention.

DETAILED DESCRIPTION OF THE INVENTION

Figure 3:
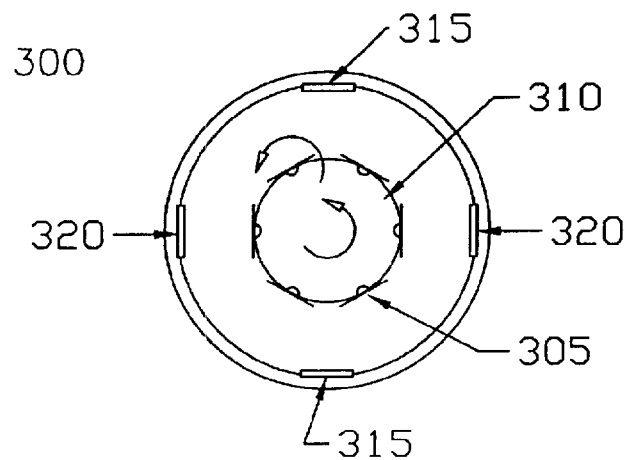
FIG. 3 is a schematic diagram of a cathodic arc deposition chamber useful in the present invention.

Titanium aluminum nitride ((Ti,Al)N) coatings are commonly used in dry and high speed machining operations because of their high oxidation resistance and abrasion resistance. A typical (Ti,Al)N coating is deposited using a TiAl target at 50/50 At %. The maximum working temperature on the (Ti,Al)N coating can reach 1450° F. The (Ti,Al)N coating is hard, with a microhardness of 2600–3000 HV, 0.05, depending on the physical vapor deposition process used. A (Ti,Al)N coating at 50/50 (At %) has a brown or purplish color, depending on the deposition conditions.

Titanium carbonitride (TiCN) is a very hard ceramic coating, having a microhardness above 3000 HV, 0.05. By controlling the proportion of nitrogen gas to acetylene or methane, TiCN can have a color ranging from a copper-style color to black.

The ceramic coating of the present invention combines the high oxidation and abrasion resistance of (Ti,Al)N, (Ti,Al)CN, (Ti,Al,X)N, and (Ti,Al,X)CN coatings and the copper-style color characteristics of TiCN coatings, if desired, for foodware having a tarnish-resistant outer heat source-contacting surface.

The purplish color of (Ti,Al)N can serve as a base for the top layer of TiCN, if a top layer is used.

The overall thickness of the coating of the present invention is generally in the range of about 0.5 to about 20 microns, depending on the foodware application. A top layer of TiCN, if used, is typically less than about 2.0 microns.

The ceramic coating of the present invention can directly touch the gas flame and electric stove heating element without burning or tarnishing in normal cooking conditions. The thermal threshold of TiCN is 750° F., and the ceramic layer (Ti,Al)N underneath can withstand temperatures of up to 1450° F. During cooking, even when the contents are under boiling conditions, the contents actually cool down the cookware dramatically. The actual temperature on the bottom of the cookware can be under 750° F. Furthermore, cookware made from clad material requires that the heating source be at a temperature below 900° F. to avoid stainless steel and aluminum (forming the clad composite) separation. Heating at medium or low setting is recommended. In this invention, because the top layer of TiCN is thin, the heat source will react with both the TiCN top layer and the ceramic layer underneath. The multilayer ceramic coating of this invention, with TiCN as the top layer, is suitable for direct heating in medium heat setting cooking conditions. The surface directly touching the heating source is at usually at a temperature below 750° F. In the case of losing the top coating of TiCN, the similarly colored (Ti,Al)N can protect the foodware from tarnish.

The first ceramic layer of (Ti,Al)N, (Ti,Al)CN, (Ti,Al,X)N, or (Ti,Al,X)CN can be the top layer, if desired. The color of the coating can vary depending on composition of the layer and the deposition conditions. The color of (Ti,Al)N, and (Ti,Al)CN can be varied from purple to smoke gray to black by controlling processes and adding different gases as is well-known to those skilled in the art. By adding other elements, such as chromium, to the (Ti,Al)N or (Ti,Al)CN forming, for example (Ti,Al,Cr)N or (Ti,Al,Cr)CN, the oxidation resistance of these coatings will be further increased. As mentioned, these coating can have variable colors by controlling the deposition process as is well-known to those skilled in the art. The top layer of (Ti,Al)N, (Ti,Al)CN, (Ti,Al,X)N, or (Ti,Al,X)CN is designed for a heating source required at high temperature applications below 1450° F.

An alternating sequence of (Ti,Al)N/TiN, (Ti,Al)CN/TiCN, (Ti,Al,X)N/XN or (Ti,Al,X)CN/XCN is desirable because it further improves the toughness and thermal stability of the coating. This makes it easier to draw a metal sheet with a thin multilayer coating without cracking the coating in the forming process. The typical thickness of each alternating layer is in the range of from about 0.1 to about 1.0 micron.

FIG. 1 shows a cross-section of one embodiment 100 of the foodware article of the present invention. There is a metal foodware article 105, such as a pan. The metal foodware article 105 has an inner food-contacting surface 110 and an outer heat source-contacting surface 115. The metal foodware article 105 can be made of various metals, including, but not limited to, steel, stainless steel, titanium, clad material, or alloys thereof. The metal foodware article can be made of a solid metal or a solid alloy, or it can be a clad material, such as a multilayer structure having a metal surface. Examples of multilayer structures, include, but are not limited to, stainless steel-clad aluminum or copper, aluminum having a plasma sprayed stainless steel coating, or metal outer layers surrounding non-metallic core materials, such as graphite.

There is a bonding layer 120 deposited on a portion of the outer heat source-contacting surface 115. The bonding layer is generally less than about 1.0 microns thick. The bonding layer can be a metal including, but not limited to, titanium, chromium, zirconium, or alloys thereof.

A first ceramic layer 125 is deposited adjacent to a portion of the bonding layer 120. The first ceramic layer 125 can be (Ti,Al)N, (Ti,Al)CN, (Ti,Al,X)N, or (Ti,Al,X)CN. The first ceramic layer 125 is typically in the range of about 0.5 to about 10 microns. The first ceramic layer 125 provides high oxidation resistance and anti-tarnish properties, even under exposure to direct high gas flame or touching an electric stove's high heating element. The first ceramic layer provides a base for the top layer, if one is included. Although the first ceramic layer 125 is shown as being deposited on the bonding layer in this embodiment, there could be one or more intervening layers between the bonding layer 120 and the first ceramic layer 125, if desired.

A top layer of TiCN 130 is deposited on a portion of the first ceramic layer 125. The TiCN layer 130 is generally in the range of about 0.1 to about 2.0 microns thick. The TiCN layer 130 provides a copper-style color for the coating, if desired. The copper-style color is determined by the color desired and the deposition processes, such as the proportion of nitrogen to acetylene or methane, deposition temperature, and vacuum level, as is well-known to those of skill in the art.

Although the TiCN layer 130 is shown as being deposited on the first ceramic layer 125 in this embodiment, there could be one or more intervening layers between the first ceramic layer 125 and the TiCN layer 130.

FIG. 2 shows a cross-section of another example 200 of a foodware article of the present invention. There is a metal foodware article 205 having an inner food-contacting surface 210 and an outer heat source-contacting surface 215. A bonding layer 220 is deposited on a portion of the outer heat source-contacting surface 215.

There are alternating layers 225, 230, 235, 240, 245, 250. Layers 225, 235, 245 can be TiN, TiCN, XN, or XCN. Although layer 225 is shown as being deposited on the bonding layer 220 in this embodiment, there could be one or more intervening layers between the bonding layer 220 and the layer 225.

Layers 230, 240, 250 can be (Ti,Al)N, (Ti,Al)CN, (Ti,Al,X)N, or (Ti,Al,X)CN. By controlling the deposition processes and gas mixture, a thermally stable, ceramic coating can be achieved.

The layers 225, 230, 235, 240, 245, 250 are typically in the range of about 0.1 to about 1.0 microns thick.

Each of the layers can be deposited over the entire outer heat source-contacting surface of the foodware article, for example, the bottom and sides of a pan, or on only part of it, for example, the bottom of the pan only.

The coating layers can be deposited using a physical vapor deposition process, such as evaporation, sputtering, cathodic arc, or ion beam, or using another suitable process.

As an example, one process for depositing a coating on a foodware article will be described. Other processes or steps can be used, as is well-known to those of skill in the art.

The foodware article can either be formed first and then coated, or a flat metal sheet can be coated and then formed into the pan. The process will be described for coating a metal sheet by cathodic arc deposition and then forming the pan.

The metal sheet can be polished before deposition to create a smooth surface, if necessary. Buffing or grinding compound, or another polishing medium, as is known to those in the art, can be used. Examples of suitable finishes include, but are not limited to, a #4 finish (surface finish about 10 micro inches), and a #8 non-directional mirror polished surface (surface finish about 2–3 micro inches).

The sheets are then thoroughly cleaned and dried to remove any grease, polish residual, loose and imbedded particles, oxides, salt residue, or other foreign material. A typical cleaning would involve an aqueous cleaning system in conjunction with ultrasonic cleaning.

The sheets are loaded into a suitable fixture, and placed in the planetary of the deposition chamber 300, as shown in FIG. 3. The sheets 305 can be subjected to one or two-fold planetary rotation during deposition, as shown. The turning table 310 can rotate all of the sheets, and the individual sheets 305 can be rotated, if desired.

Appropriate targets 315 and 320 are placed in the chamber as shown in FIG. 3. For example, compressed metal powder targets 320 of 50% titanium/50% aluminum (At %) can be used, along with metal targets 315 of pure titanium. The schematic diagram of FIG. 3 is a typical model to form a superlattice structured layer of (Ti,Al)N/TiN when all targets 315 and 320 are operating in a deposition process. The alloy targets could also be a compressed metal powder of a combination of titanium, aluminum, and X used in conjunction with pure metal targets, as well as other combinations, as is well known to those of skill in the art. The number and type of targets will depend on the size of the chamber and the coating being deposited.

The chamber is pumped to a pressure of about $10^{-3}$ Pa. The sheets are heated to a temperature in the range of about 350° F.–450° F., depending on the thickness, size, quantity of sheets, and the type of material.

A glow discharge is created by biasing the sheets with a negative voltage at 800–1200V to micro-clean the sheets.

The bonding layer is deposited first. The appropriate targets are ignited (for example, Ti) and the pan is bombarded with ions ($Ti^+$) at a bias voltage of about 600–1000V at a vacuum level of about $10^{-2}$ Pa, forming a bonding layer typically with a thickness of less than about 1.0 micron.

The titanium aluminum targets are turned on, and the titanium targets are turned off. Nitrogen is then introduced into the system to form a layer of (Ti,Al)N. The applied negative bias voltage is about 80–200V at a vacuum level of about 0.4–1.5 Pa. The (Ti,Al)N layer provides high abrasion and oxidation resistance.

The TiAl targets are turned off, while the titanium targets are turned on. Methane or acetylene is introduced, in addition to the nitrogen already present to deposit a layer of TiCN at a bias voltage of about 80–200V. The TiCN layer provides the copper-style color. The color can be varied by changing the process conditions and proportion of nitrogen to methane or acetylene during the physical vapor deposition process. The composition of the (Ti,Al)N and TiCN layers can be varied by altering the number and type of targets being used for each layer and controlling the deposition processes, as is well-known to those of skill in the art. The deposition temperature can be raised up to about 600–900° F. at the end of deposition.

Additional layers can be added between the various layers as desired. Alternating layers of (Ti,Al)N and TiN; (Ti,Al)CN and TiCN; (Ti,Al,X)N and XN; or (Ti,Al,X)CN and XCN can be deposited. The (Ti,Al,X)N or (Ti,Al,X)CN can be a superlattice structured layer, if desired.

A layer of polyvinyl chloride film (or other suitable protective layer) can be applied to the coated surface of the sheets to protect the coating from damage during forming.

The method of making a foodware article by coating a blank and shallow drawing the blank into a pan is well suited for foodware articles having a shape with a radius to avoid surface texture change in the radius area during drawing. In this process, the surface finish is typically in the range of 10–16 micro inches. The highly polished surface finish of less than 10 micro inches can be used for foodware with a very large radius at shallow drawing.

Experiment 1

Blanks of 304 stainless steel measuring 8"×8" and 0.8 inch thick were coated using the above described process. The blanks had commercial #4 satin and #8 mirror finishes. The coated blanks were drawn into 6" diameter pans.

Figure 4:
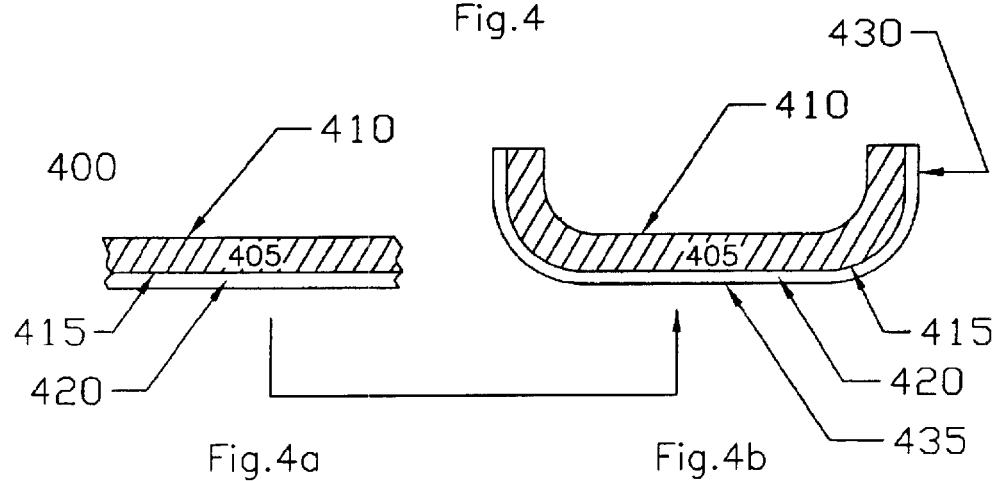
FIG. 4 is a schematic drawing of a metal blank coated by the present invention and shallow-drawn into a pan.

FIG. 4a shows the coated blank 400. There is a blank 405, which has a surface 410 which will contact the food when the pan is formed and an opposite surface 415 which will be the outer heat source-contacting surface when the pan is formed. The coating 420 was formed on surface 415, although the individual layers are not shown. The 8" diameter coated blank was then shallow drawn into a 6" diameter pan with a flat bottom as shown in FIG. 4b. The coated surface is the heat source-contacting surface of the pan. The sidewalls 430 are perpendicular to the bottom 435 with a radius.

The coating of the present invention adhered well on all surfaces, including the radius area. The #4 surface finish pans had no significant change of surface texture in the radius area as compared to the bottom surface. The highly polished pans with the #8 mirror surface showed a visible surface texture difference in the radius area as compared to the bottom's mirror surface.

Experiment 2

Foodware articles of the present invention were tested for thermal stability and tarnish resistance by boiling water in pans made according to the present invention over direct gas flame and electric heating elements. The coated surface of the cookware was continuously heated for about 1.5–2 hours. This is a rather severe test compared to typical cooking conditions. The procedure was repeated 2–3 times, and the results are shown in Table 1.

Examples 1 and 2 were traditional stainless steel pots with a bottom and low sidewalls electroplated with copper. After boiling for one and two hours over high gas flame, the bottom surface showed severe oxidation and black tarnish spots. The dark oxidation spots were much worse on the bottom of the pan after two hours (Example 2), which was typical tarnish appearance on copper cookware. In that example, the tarnished spots had to be polished to be removed.

Examples 3–10 show the performance of the coating of the present invention. In Examples 3 and 4, cookware was coated with the coating of the present invention. In Examples 5–10, 8" blanks were coated, and 6" pans were formed from the coated blanks.

In the electric stove heating, the outside diameter of the heating element is about 6 inches. When the 6" pan sits on the heating element, the radius area of the pan directly touches the outside heating element. The heating element can reach 950° F. at a "high" setting. This test is a good evaluation of the coating adhesion and tarnish resistance of the formed surface, including the bottom, the sides, and the radius.

Example 3 was a stainless steel bowl with a layer of (Ti,Al)N and a top layer of TiCN. Water was boiled in the bowl over a low gas flame for two hours. There were only a few slightly darkened spots, which are the deposits from the gas flame. The deposits were almost completely removed by cleaning with hot water and a towel.

Example 4 was a stainless steel pot with a layer of (Ti,Al)N and a top layer of TiCN. The pot was heated on an electric stove for 1 hour, over a middle gas flame for 3 hours, over a low gas flame for 2 hours, and over a high gas flame for 1.5 hours (total time was 7.5 hours). The pot showed discoloration around the grate marks. The discolored area is the deposit from the gas flame reacting with dirt on the grate through heating for the period of 6.5 hours. The pot was washed with hot, soapy water with a dishcloth, rinsed in hot water, and dried thoroughly, using only the towel to rub off the dirty spots and the grate marks. After cleaning in this manner, the grate marks had almost completely disappeared. The pot maintained its copper-style color.

Example 5 was a stainless steel pan with a layer of (Ti,Al)N and a top layer of TiCN with a copper-style color. Water was boiled in the pan over an electric stove at a high temperature setting. The electric heating element was in contact with the bottom of the pan. After heating for two hours, the bottom surface of some of the area touching the heating element showed a slight dark circle. This could be cleaned by hot, soapy water and a dry towel. The radius area of the pan had no color change, even though this area was in direct contact with the heating element, where the temperature of the heating element can reach 950° F.

Example 6 was a stainless steel pan with a top coating of (Ti,Al)N. Water was boiled over an electric stove at a high temperature setting. The appearance of the bottom of the pan was basically unchanged. Windex™ cleaner was used to clean it up.

Example 7 used the same pan as Example 6, but it was heated over a high gas flame. After boiling water for two hours, the bottom of the pan showed gas flame deposits around the grate. These deposits can be removed easily with hot, soapy water or Bar Keepers™ cleaner. The bottom of the pan retained its appearance.

Examples 8 and 9 were the same pan with a top coating of TiCN with a rose gold color. Water was boiled in the pan for 1.5 hours over an electric stove at a high temperature setting (Example 8) and over a medium flame setting on a gas stove (Example 9). Heating over the electric stove showed only a few small darkened spots. Heating over the gas flame showed some darkened, brown spots. These spots could be easily cleaned by hot, soapy water and a dry towel, or Windex™ Cleaner.

Example 10 was a pre-formed pot coated with a multi-layer coating with a top layer of (Ti,Al,Cr)N with a metallic gray color. Water was boiled over a high gas flame for 2 hours. The bottom of the pot showed some flame deposits, which were cleaned with hot, soapy water, or Bar Keepers™ cleaner.

In these examples, the gas flame deposit or grate mark became visible after heating. In order to show that the deposits or grate marks were not tarnish or oxidation, in Example 11 the pan (the same one used in Example 7) was not placed directly on the grate, but was situated on a shaft. The bottom of the pan was heated by the gas flame without the pan physically touching anything. The bottom surface was constantly at a temperature of 1100–1200° F. because of the gas flame. After heating for two hours, the bottom surface had no visible change, nor was there any gas flame deposit. Thus, the grate marks were formed by a reaction of the gas flame with the dirt on the grate, and were not tarnish.

TABLE 1

| Example | Cookware/ Coating | Top Coating/ Color | Boiling Water (Hrs.) Gas Stove | Boiling Water (Hrs.) Electrical Stove | Surface Appearance of Cookware After Boiling Bottom | Surface Appearance of Cookware After Boiling Radius Area | Bar Keepers ™ H-S & Towel[1] | or Lemon Juice[2] | Windex[3] | Polish[4] |
|---|---|---|---|---|---|---|---|---|---|---|
| 1 | S.S. pot, bottom electrical plated copper | Copper | 1.0 Hr. (H) | | Tarnished, black spots | | | | | X |
| 2 | S.S. pot, bottom electrical plated copper | Copper | 2.0 Hrs. (H) | | Severe tarnish, black spots | | | | | X |

TABLE 1-continued

| Example | Cookware/ Coating | Top Coating/ Color | Boiling Water (Hrs.) Gas Stove | Boiling Water (Hrs.) Electrical Stove | Surface Appearance of Cookware After Boiling Bottom | Surface Appearance of Cookware After Boiling Radius Area | H-S & Towel[1] | Bar Keepers ™ or Lemon Juice[2] | Windex[3] | Po- lish[4] |
|---|---|---|---|---|---|---|---|---|---|---|
| 3 | S.S. pot/ 101-2 | TiCN/ Copper | 2.0 Hrs. (L) | | 5 Small brownish spots | No Change | X | | | |
| 4 | S.S. pot/ 919(2) | TiCN/ Copper | 1.5 Hrs. (H), 3.0 Hrs. (M), 2.0 Hrs. (L) | 1 Hr. (H) | Grate marks | No Change | X | | | |
| 5 | S.S. pan/ 919(4) | TiCN/ Copper | | 2 Hrs. (H) | One slight dark circle where heating element was in contact | No Change | X | | | |
| 6 | S.S. pan/ 1029-2 | TiAlN/ purple | | 2 Hrs. (H) | A few darkened spots | No Change | | | X | |
| 7 | S.S. pan/ 1029-2 | TiAlN/ purple | 2.0 Hrs. (H) | | Some gas flame deposits around grate | No Change | X | X | | |
| 8 | S.S. pan/ 115-1 | TiCN/ Rose Gold | | 1.5 Hrs. (H) | A few small Darkened spots | No Change | | | X | |
| 9 | S.S. pan/ 115-1 | TiCN/ Rose Gold | 1.5 Hrs. (M) | | Some darkened areas/ No flame deposits shown at grate area | No Change | X | | | |
| 10 | S.S. pot/ 1-14 | (Ti, Al, Cr)N/ Grey | 2.0 Hrs. (H) | | Some gas flame deposits around grate | No Change | X | X | | |
| 11 | S.S. pan/ 1029-2 | TiAlN/ purple | 2.0 Hrs. (H) | | No visible change | No Change | | | X | |

[1]Cleaned with hot, soapy water and dried with a towel.
[2]Cleaned with Bar Keepers ™ cleaner or lemon juice.
[3]Cleaned with Windex.
[4]Polished with compound suitable for copper.

The multilayer ceramic coating of the present invention provides a coating with thermally stable color. The coating displays high oxidation resistance and tarnish resistance, even under direct exposure to gas flame and electric heating elements over a long period of time. The foodware articles are easily cleaned and maintain their copper-style or other color. The multilayer coating of the present invention adhered well at the radius area during forming and also exhibits good tarnish resistance over direct heating. The coating of the present invention provides the ability to coat sheets or blanks and then form the sheets or blanks into pans. This is more economical than coating individual pans, although this can also be done if desired.

The top layer of (Ti,Al)N, (Ti,Al)CN, (Ti,Al,X)N, or (Ti,Al,X)CN is designed for high temperature heating conditions. The ceramic coating maintains its color (from metallic to brown, and purple to black) even under high temperature heating conditions. Although some electric and gas flame stoves can reach 1500–1660° F., the liquid content in the cookware cools down the heating surface dramatically. The heating surface will generally not reach the thermal threshold of 1450° F. for the (Ti,Al)N coating. Therefore, ceramic coatings of (Ti,Al,X)N and (Ti,Al,X)CN can be used in any heating source available in cookware industries. The coating of a layer of (Ti,Al)N and a top layer of TiCN coating is suitable for low to medium heat setting conditions when cooking. The coating with a layer of (Ti,Al)N and top layer of TiCN has a copper-style color and tarnish-resistant performance. This coating opens the door to use in cookware that traditionally made use of copper.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A foodware article having a thermally-stable color, tarnish-resistant, ceramic coating comprising:
    a metal foodware article having an inner food-contacting surface and an outer heat source-contacting surface;
    a bonding layer deposited on a portion of the outer heat source-contacting surface;
    a first ceramic layer deposited adjacent to a portion of the bonding layer on a side of the bonding layer opposite the outer heat source-contacting surface, the first ceramic layer selected from (Ti,Al)N, (Ti,Al)CN, (Ti,Al,X)N, or (Ti,Al,X)CN, wherein the ceramic coating is tarnish-resistant and maintains the thermally-stable color after contact with a heat source.

2. The foodware article of claim 1 further comprising a top layer of TiCN deposited adjacent to a portion of the first ceramic layer on a side of the first ceramic layer opposite the outer heat source-contacting surface.

3. The foodware article of claim 1 further comprising a second ceramic layer deposited between the bonding layer and the first ceramic layer, the second ceramic layer being selected from TiN, TiCN, XN, or XCN.

4. The foodware article of claim 1 further comprising alternating layers of a third ceramic selected from (Ti,Al)N, (Ti,Al)CN, (Ti,Al,X)N, or (Ti,Al,X)CN and a fourth ceramic selected from TiN, TiCN, XN or XCN deposited between the bonding layer and the first ceramic layer.

5. The foodware article of claim 4 wherein each of the alternating layers is in the range of about 0.1 to about 1.0 microns thick.

6. The foodware article of claim 1 wherein the metal foodware article is made of a material selected from steel, stainless steel, titanium, clad material, or alloys thereof.

7. The foodware article of claim 1 wherein the bonding layer is a metal selected from titanium, chromium, zirconium, or alloys thereof.

8. The foodware article of claim 1 wherein a total thickness of the coating is in the range of about 0.5 to about 20 microns.

9. The foodware article of claim 1 wherein the ceramic coating has a top layer selected from (Ti,Al)N, (Ti,Al)CN, (Ti,Al,X)N, or (Ti,Al,X)CN.

10. A foodware article having a thermally-stable color, tarnish-resistant, ceramic coating comprising:
   a metal foodware article having an inner food-contacting surface and an outer heat source-contacting surface;
   a bonding layer deposited on a portion of the outer heat source-contacting surface;
   a second ceramic layer deposited adjacent to the bonding layer on a side of the bonding layer opposite the outer heat source-contacting surface, the second ceramic layer being selected from TiN, TiCN, XN, or XCN;
   a first ceramic layer deposited adjacent to a portion of the second ceramic layer on a side of the second ceramic layer opposite the outer heat source-contacting surface, the first ceramic layer selected from (Ti,Al)N, (Ti,Al)CN, (Ti,Al,X)N, or (Ti,Al,X)CN, wherein the ceramic coating tarnish-resistant and maintains the thermally-stable color after contact with a heat source.

11. The foodware article of claim 10 further comprising a top layer of TiCN deposited adjacent to a portion of the first ceramic layer on a side of the first ceramic layer opposite the outer heat-source contacting surface.

12. The foodware article of claim 10 further comprising alternating layers of a third ceramic selected from (Ti,Al)N, (Ti,Al)CN, (Ti,Al,X)N, or (Ti,Al,X)CN and a fourth ceramic selected from TiN, TiCN, XN or XCN deposited between the bonding layer and the first ceramic layer.

13. The foodware article of claim 12 wherein each of the alternating layers is in the range of about 0.1 to about 1.0 microns thick.

14. The foodware article of claim 10 wherein the metal foodware article is made of a material selected from steel, stainless steel, titanium, clad material, or alloys thereof.

15. The foodware article of claim 10 wherein the bonding layer is a metal selected from titanium, chromium, zirconium, or alloys thereof.

16. The foodware article of claim 10 wherein a total thickness of the coating is in the range of about 0.5 to about 20 microns.

17. A foodware article having a thermally-stable color, tarnish-resistant, ceramic coating comprising:
   a metal foodware article having an inner food-contacting surface and an outer heat source-contacting surface;
   a bonding layer deposited on a portion of the outer heat source-contacting surface;
   a second ceramic layer deposited adjacent to the bonding layer on a side of the bonding layer opposite the outer heat source-contacting surface, the second ceramic layer being selected from TiN, TiCN, XN, or XCN;
   a first ceramic layer deposited adjacent to a portion of the second ceramic layer on a side of the second ceramic layer opposite the outer heat source-contacting surface, the first ceramic layer selected from (Ti,Al)N, (Ti,Al)CN, (Ti,Al,X)N, or (Ti,Al,X)CN; and
   a top layer of TiCN deposited adjacent to a portion of the first ceramic layer on a side of the first ceramic layer opposite the outer heat-source contacting surface, wherein the ceramic coating is tarnish-resistant and maintains the thermally-stable color after contact with a heat source.

18. The foodware article of claim 17 further comprising alternating layers of a third ceramic selected from (Ti,Al)N, (Ti,Al)CN, (Ti,Al,X)N, or (Ti,Al,X)CN and a fourth ceramic selected from TiN, TiCN, XN or XCN deposited between the bonding layer and the first ceramic layer.

19. The foodware article of claim 18 wherein each of the alternating layers is in the range of about 0.1 to about 1.0 microns thick.

\* \* \* \* \*

UNITED STATES PATENT AND TRADEMARK OFFICE
CERTIFICATE OF CORRECTION

PATENT NO. : 6,942,935 B2
APPLICATION NO. : 10/395453
DATED : September 13, 2006
INVENTOR(S) : Molly Mo Hui Ge It is certified that error appears in the above-identified patent and that said Letters Patent is hereby corrected as shown below:

Item [73]
Assignee: "National Material IP," should read --National Material LP,--

Col. 10, Line 54, "selected in" should read --selected from--

Col. 11, Line 23, "coating tarnish-resistant" should read --coating is tarnish-resistant--

Signed and Sealed this

Twenty-second Day of August, 2006

JON W. DUDAS
*Director of the United States Patent and Trademark Office*

UNITED STATES PATENT AND TRADEMARK OFFICE
CERTIFICATE OF CORRECTION

PATENT NO.       : 6,942,935 B2                                               Page 1 of 1
APPLICATION NO.  : 10/395453
DATED            : September 13, 2005
INVENTOR(S)      : Molly Mo Hui Ge It is certified that error appears in the above-identified patent and that said Letters Patent is hereby corrected as shown below:

Item [73]
Assignee: "National Material IP," should read --National Material LP,--

Col. 10, Line 54, "selected in" should read --selected from--

Col. 11, Line 23, "coating tarnish-resistant" should read --coating is tarnish-resistant--

This certificate supersedes Certificate of Correction issued August 22, 2006.

Signed and Sealed this

Tenth Day of October, 2006

JON W. DUDAS
*Director of the United States Patent and Trademark Office*